United States Patent
Drewes et al.

(10) Patent No.: US 7,112,454 B2
(45) Date of Patent: Sep. 26, 2006

(54) SYSTEM AND METHOD FOR REDUCING SHORTING IN MEMORY CELLS

(75) Inventors: Joel A. Drewes, Boise, ID (US); James G. Deak, Eden Prairie, MN (US)

(73) Assignee: Micron Technology, Inc., Boise, ID (US)

( * ) Notice: Subject to any disclaimer, the term of this patent is extended or adjusted under 35 U.S.C. 154(b) by 293 days.

(21) Appl. No.: 10/684,967

(22) Filed: Oct. 14, 2003

(65) Prior Publication Data

US 2005/0079638 A1   Apr. 14, 2005

(51) Int. Cl.
*H01L 21/70* (2006.01)
*G11C 11/15* (2006.01)

(52) U.S. Cl. .................. 438/3; 438/238; 438/624; 365/173; 257/E21.66

(58) Field of Classification Search ............... 438/3, 438/238, 624; 365/173; 257/E43.001, E21.665
See application file for complete search history.

(56) References Cited

U.S. PATENT DOCUMENTS

| | | | |
|---|---|---|---|
| 3,623,032 A | 11/1971 | Schapira | |
| 3,623,035 A | 11/1971 | Kobayashi et al. | |
| 3,816,909 A | 6/1974 | Maeda et al. | |
| 3,947,831 A | 3/1976 | Kobayashi et al. | |
| 4,044,330 A | 8/1977 | Johnson et al. | |
| 4,060,794 A | 11/1977 | Feldman et al. | |
| 4,158,891 A | 6/1979 | Fisher | |
| 4,455,626 A | 6/1984 | Lutes | |
| 4,731,757 A | 3/1988 | Daughton et al. | |
| 4,780,848 A | 10/1988 | Daughton et al. | |
| 4,801,883 A | 1/1989 | Muller et al. | |
| 4,849,695 A | 7/1989 | Muller et al. | |
| 4,945,397 A | 7/1990 | Schuetz | |
| 5,039,655 A | 8/1991 | Pisharody | |
| 5,064,499 A | 11/1991 | Fryer | |
| 5,140,549 A | 8/1992 | Fryer | |
| 5,496,759 A | 3/1996 | Yue et al. | |
| 5,547,599 A | 8/1996 | Wolfrey et al. | |
| 5,569,617 A | 10/1996 | Yeh et al. | |

(Continued)

FOREIGN PATENT DOCUMENTS

DE   198 36 567 A1   2/2000

(Continued)

OTHER PUBLICATIONS

Chen et al., "Magnetic tunnel junction pattern technique," *Journal of Applied Physics*, vol. 93, No. 10, May 15, 2003, pp. 8379-8381.

(Continued)

*Primary Examiner*—Zandra V. Smith
*Assistant Examiner*—Pamela E Perkins
(74) *Attorney, Agent, or Firm*—Knobbe Martens Olson & Bear LLP

(57) ABSTRACT

An MRAM device includes an array of magnetic memory cells having an upper conductive layer and a lower conductive layer separated by a barrier layer. To reduce the likelihood of electrical shorting across the barrier layers of the memory cells, spacers can be formed around the upper conductive layer and, after the layers of the magnetic memory cells have been etched, the memory cells can be oxidized to transform any conductive particles that are deposited along the sidewalls of the memory cells as byproducts of the etching process into nonconductive particles. Alternatively, the lower conductive layer can be repeatedly subjected to partial oxidation and partial etching steps such that only nonconductive particles can be thrown up along the sidewalls of the memory cells as byproducts of the etching process.

36 Claims, 6 Drawing Sheets

U.S. PATENT DOCUMENTS

| | | | |
|---|---|---|---|
| 5,587,943 | A | 12/1996 | Torok et al. |
| 5,650,958 | A | 7/1997 | Gallagher et al. |
| 5,701,222 | A | 12/1997 | Gill et al. |
| 5,726,498 | A | 3/1998 | Licata et al. |
| 5,741,435 | A | 4/1998 | Beetz, Jr. et al. |
| 5,756,366 | A | 5/1998 | Berg et al. |
| 5,795,823 | A | 8/1998 | Avanzino et al. |
| 5,804,458 | A * | 9/1998 | Tehrani et al. ............... 438/3 |
| 5,861,328 | A | 1/1999 | Tehrani et al. |
| 5,926,394 | A | 7/1999 | Nguyen et al. |
| 5,956,267 | A | 9/1999 | Hurst et al. |
| 5,982,658 | A | 11/1999 | Berg et al. |
| 6,028,786 | A | 2/2000 | Nishimura |
| 6,048,739 | A | 4/2000 | Hurst et al. |
| 6,136,705 | A | 10/2000 | Blair |
| 6,153,443 | A | 11/2000 | Durlam et al. |
| 6,174,737 | B1 | 1/2001 | Durlam et al. |
| 6,218,302 | B1 | 4/2001 | Braeckelmann et al. |
| 6,338,899 | B1 | 1/2002 | Fukuzawa et al. |
| 6,358,756 | B1 | 3/2002 | Sandhu et al. |
| 6,379,978 | B1 | 4/2002 | Goebel et al. |
| 6,391,658 | B1 | 5/2002 | Gates et al. |
| 6,392,922 | B1 | 5/2002 | Liu et al. |
| 6,440,753 | B1 | 8/2002 | Ning et al. |
| 6,485,989 | B1 | 11/2002 | Signorini |
| 6,627,913 | B1 * | 9/2003 | Chen ........................ 257/10 |
| 6,770,491 | B1 | 8/2004 | Tuttle |
| 6,783,995 | B1 | 8/2004 | Hineman et al. |
| 6,855,563 | B1 * | 2/2005 | Motoyoshi ................ 438/3 |
| 6,911,156 | B1 * | 6/2005 | Grynkewich et al. ......... 216/22 |
| 2002/0041514 | A1 | 4/2002 | Scheler et al. |
| 2002/0076572 | A1 * | 6/2002 | Engelhardt et al. ......... 428/607 |

FOREIGN PATENT DOCUMENTS

| | | |
|---|---|---|
| EP | 0 776 011 A2 | 5/1997 |
| JP | 2000-30222 | 1/2000 |
| WO | WO 98/20496 | 5/1998 |
| WO | WO 00/19440 | 4/2000 |

OTHER PUBLICATIONS

Kula et al., "Development and process control of magnetic tunnel junctions for magnetic random access memory devices," *Journal of Applied Physics*, vol. 93, No. 10, May 15, 2003, pp. 8373-8375.

Pohm et al., "Experimental and Analytical Properties of 0.2 Micron Wide, Multi-Layer, GMR, Memory Elements," *IEEE Transactions on Magnetics*, vol. 32, No. 5, Sep. 1996, pp. 4645-4647.

Pohm et al., "The Architecture of a High Performance Mass Store with GMR Memory Cells," *Nonvolatile Electronics*, Honeywell Brochure, pp. 1-3.

Prinz, Gary A., "Magnetoelectronics," *Science*, vol. 282, Nov. 27, 1998, pp. 1660-1663.

Razavi et al., "Design Techniques for High-Speed, High Resolution Comparators," *IEEE Journal of Solid-State Circuits*, vol. 27, No. 12, Dec. 1992, pp. 1916-1926.

Wang et al., "Feasibility of Ultra-Dense Spin-Tunneling Random Access Memory," *IEEE Transactions on Magnetics*, vol. 33, No. 6, Nov. 1997, pp. 4498-4512.

* cited by examiner

SYSTEM AND METHOD FOR REDUCING SHORTING IN MEMORY CELLS

BACKGROUND OF THE INVENTION

1. Field of the Invention

The present invention relates to magnetic random access memory (MRAM) devices. More specifically, the present invention relates to reducing electrical shorting in the memory cells of an MRAM device.

2. Description of the Related Art

Magnetic random access memory (MRAM) is a well-known form of memory. In an MRAM device, digital bits of information can be stored as alternative directions of magnetization in a magnetic storage element or cell. The storage elements may be simple structures, such as thin ferromagnetic films, or more complex layered magnetic thin-film structures, such as tunneling magnetoresistance (TMR) or giant magnetoresistance (GMR) elements.

An exemplary TMR memory cell comprises two magnetic layers separated by a barrier layer. One magnetic layer, referred to as the "pinned" layer, has a fixed magnetization direction, whereas the magnetization direction of the other magnetic layer, referred to as the "sense" layer, can be reversed by applying a magnetic field that is not strong enough to affect the magnetization direction of the pinned layer.

A TMR memory cell can operate by allowing a quantum mechanical tunneling of electrons from one magnetic layer to the other through the barrier layer of the cell. The passage of electrons through the barrier layer depends upon the magnetization direction of the sense layer relative to that of the pinned layer. Electrons pass more freely when the magnetic directions of the layers are aligned and less freely when the magnetic directions of the layers are not aligned. Therefore, the state of a memory cell can be determined by observing the degree of electron tunneling through the barrier layer. GMR memory cells operate similarly by sensing current flow or resistance through aligned or anti-aligned magnetic layers, rather than by employing a tunneling dielectric.

A TMR memory cell cannot function properly unless the sense layer and the pinned layer of the cell are electrically isolated from one another. If a short circuit occurs between these two layers, then there will be no tunneling of electrons through the barrier layer.

A plurality of magnetic memory cells can be organized into an array having any of a wide variety of configurations. One exemplary configuration is a "cross-point" memory array, which comprises a first set of parallel conductive lines covered by an insulating layer, over which lies a second set of parallel conductive lines, perpendicular to the first lines. One set of conductive lines is referred to as the "bit" lines, and the other set of conductive lines is referred to as the "word" lines. The magnetic memory cells can be sandwiched between the bit lines and the word lines at their intersections.

SUMMARY OF THE INVENTION

In one embodiment of the present invention, a method of forming a magnetic memory cell comprises providing a first conductive layer as a blanket layer, providing a barrier layer as a blanket layer over the first conductive layer, and providing a second conductive layer as a blanket layer over the barrier layer. The method further comprises providing a hard mask over the second conductive layer, wherein the hard mask defines the region in which the magnetic memory cell is formed, etching the second conductive layer to form an upper portion of the magnetic memory cell, and forming a spacer around the upper portion of the magnetic memory cell. The method further comprises etching the barrier layer and the first conductive layer to form a lower portion of the magnetic memory cell, wherein conductive particles of the first conductive layer may be thrown up along a sidewall of the magnetic memory cell as byproducts of the etching of the first conductive layer, and oxidizing the magnetic memory cell, thereby transforming the conductive particles into nonconductive particles.

In another embodiment, a method of forming a magnetic memory cell comprises providing a first conductive layer, a barrier layer, and a second conductive layer as blanket layers, providing a hard mask over the second conductive layer, wherein the hard mask defines the region in which the magnetic memory cell is formed, and etching the second conductive layer and the barrier layer to form an upper portion of the magnetic memory cell. The method further comprises partially oxidizing the first conductive layer such that at least a portion of the first conductive layer is transformed into an insulating material, at least partially etching the portion of the first conductive layer that was transformed into an insulating material during the partial oxidizing step, and repeating the partial oxidizing and partial etching steps until the first conductive layer forms a lower portion of the magnetic memory cell.

In another embodiment, a magnetic memory cell comprises a lower layer comprising a first conductive material, a middle layer comprising an insulating material, and an upper layer comprising a second conductive material. The magnetic memory cell further comprises a nonconductive layer comprising an oxide of the first conductive material, wherein the nonconductive layer is coated along a sidewall of the magnetic memory cell such that it can be in contact with both the upper and lower layers.

In another embodiment, a magnetic memory cell comprises a lower layer comprising a first conductive material and a middle layer comprising an insulating material. The magnetic memory cell further comprises an upper layer comprising a second conductive material surrounded by a spacer material and at least one sidewall coated with oxidized particles of the first conductive material.

BRIEF DESCRIPTION OF THE DRAWINGS

These and other features and advantages of the invention will now be described with reference to the drawings of certain preferred embodiments, which are intended to illustrate, and not to limit, the invention. In the figures, like reference numerals are used to refer to like elements.

DETAILED DESCRIPTION OF THE PREFERRED EMBODIMENTS

For purposes of illustration, various embodiments of the invention will be described in the context of a TMR magnetic memory cell having a particular configuration. The details associated with this specific configuration are set forth to illustrate, and not to limit, the invention. For example, the invention can be implemented with TMR magnetic memory cells having alternative configurations or with other types of memory cells. The scope of the invention is defined only by the appended claims.

Figure 1:
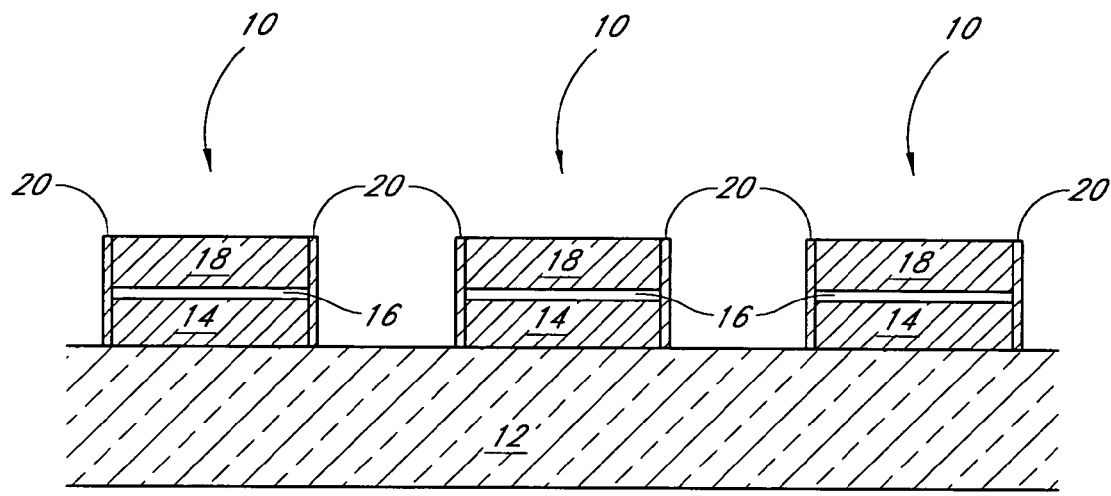
FIG. 1 illustrates a plurality of conventional TMR magnetic memory cells.

FIG. 1 illustrates a plurality of conventional magnetic memory cells 10 formed on a metal conducting line 12, preferably copper or aluminum, which is deposited on a substrate (not shown). The conducting line 12 extends to the right and to the left of the page. The memory cells 10 can be formed by first depositing a pinned layer 14 on the conducting line 12, depositing an insulating barrier layer 16 over the pinned layer 14, and depositing a sense layer 18 over the barrier layer 16. The pinned layer 14, barrier layer 16, and sense layer 18 can then be patterned and etched to form the memory cells 10 using methods that are well-known to those of skill in the art.

The pinned layer 14 may comprise a stack of magnetic and associated adjacent sublayers. For example, the pinned layer 14 may comprise a tantalum seed sublayer, a nickel-iron seed sublayer, a magnesium oxide, iridium-manganese, platinum-manganese or nickel-manganese pinning sublayer, and a nickel-iron, nickel-iron-cobalt, cobalt-iron or nickel-iron-chromium sublayer. The baffler layer 16 is preferably thin enough to allow the tunneling of electrons from the sense layer 18 to the pinned layer 14. The barrier layer 16 may comprise, for example, aluminum oxide, having a thickness within the range of about 0.5 nm to about 3 nm, preferably within the range of about 1 nm to about 2 nm. Like the pinned layer 14, the sense layer 18 may comprise a stack of magnetic and associated adjacent blanket sublayers. For example, the sense layer 18 may comprise a tantalum sublayer, a tungsten nitride sublayer, and a nickel-iron, nickel-iron-cobalt, cobalt-iron, cobalt or copper sublayer.

During the fabrication of a conventional magnetic memory cell 10, it is common for a thin coating of conductive material 20 to form along the sidewalls of the memory cell 10, as illustrated in FIG. 1. This coating of conductive material 20 may comprise, for example, particles of the pinned layer 14 that are thrown up along the sidewalls of the memory cell 10 during the process of etching through the pinned layer 14, particularly if an etching process with a physical component is used, such as an ion milling process or a reactive ion etch.

The thin coating of conductive material 20 along the sidewalls of the memory cell 10 is undesirable because it can create a conductive path between the pinned layer 14 and the sense layer 18. Such a conductive path creates an electrical short across the barrier layer 16 that can prevent the memory cell 10 from functioning properly. Therefore, the coating of conductive material 20 along the sidewalls of the memory cells 10 can undesirably reduce the yield of the manufacturing process. Although an additional cleaning step can be performed to remove the coating of conductive material 20 from the sidewalls of the memory cells 10, such an additional step can add cost to the manufacturing process and can also have a harmful effect on the remaining structures.

Figure 2:
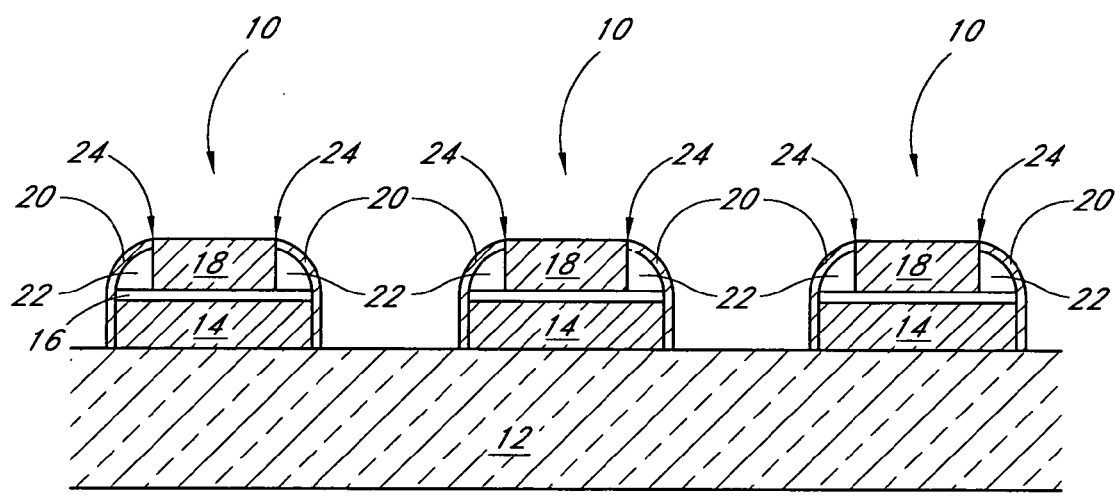
FIG. 2 illustrates a plurality of magnetic memory cells with insulating spacers adjacent to the sense layers.

FIG. 2 illustrates a plurality of magnetic memory cells 10 with spacers 22 adjacent to the sense layers 18. The spacers 22 preferably comprise a nonconductive material, such as, for example, silicon nitride, diamond-like carbon, silicon carbide, or an oxide such as silicon oxide or aluminum oxide. The spacers 22 can be formed using a variety of well-known techniques. For example, the sense layer 18 can be patterned and etched with a hard or resist mask in place, followed by the deposition of a blanket layer of nonconductive material. The resulting structure can then be subjected to a spacer etch, followed by etching through the underlying pinned layer 14.

Although a coating of conductive material 20 can form along the sidewalls of the memory cells 10, the spacers 22 advantageously reduce the likelihood that such a coating will form a conductive path between the sense layer 18 and the pinned layer 14 of a given memory cell 10 by largely protecting the sense layer 18 during etching of the pinned layers 14. Therefore, the spacers 22 can advantageously reduce the number of memory cells 10 that short out, thereby increasing the yield of the manufacturing process. Even in a memory cell 10 having a spacer 22 adjacent to the sense layer 18, however, an electrical short across the barrier layer 16 can still occur due to, inter alia, a small point of contact 24 between the coating of conductive material 20 and the sense layer 18.

FIGS. 3A–3G illustrate a process for forming a magnetic memory cell 10 in accordance with one embodiment of the invention. Although the memory cell 10 of the illustrated embodiment comprises a TMR magnetic memory cell having a particular configuration, the memory cell 10 could have a wide variety of alternative configurations. For example, in the illustrated embodiment, the pinned layer 14 is the bottom layer of the memory cell 10. In other embodiments, the pinned layer 14 may be the top layer of the memory cell 10. These and many other variations will become apparent to those of skill in the art in view of the present disclosure.

The process of the illustrated embodiment begins by depositing a pinned layer 14, a barrier layer 16, and a sense layer 18 on a conductive line 12. As discussed above, the pinned layer 14 may comprise a stack of magnetic and associated adjacent sublayers, the barrier layer 16 preferably comprises a nonconductive material through which electron tunneling can occur, and the sense layer 18 may comprise a stack of magnetic and associated adjacent sublayers.

These layers can be formed using a wide variety of well-known methods and materials. For example, in some embodiments, both the pinned layer 14 and the sense layer 18 comprise a ferromagnetic material that is an alloy of any of several metals, such as, for example, iron, nickel, and/or cobalt having a thickness preferably within the range of about 1 nm to about 30 nm, more preferably within the range of about 2.5 nm to about 20 nm, and still more preferably within the range of about 5 nm to about 10 nm. In some embodiments, the barrier layer 16 comprises an oxide of a metal, such as, for example, aluminum oxide, having a thickness preferably within the range of about 0.5 nm to about 3 nm, more preferably within the range of about 1 nm to about 2 μm. Those of ordinary skill in the art will understand that these materials and thickness ranges are exemplary, and that different materials having different thicknesses could be used.

Figure 3A:
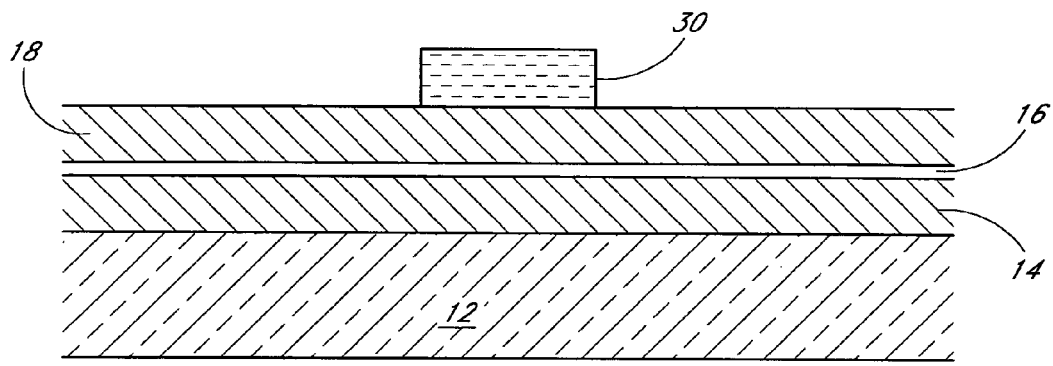
FIGS. 3A–3G illustrate the formation of a magnetic memory cell in accordance with one embodiment of the invention.

As illustrated in FIG. 3A, a hard mask 30 can be deposited as a blanket layer over the sense layer 18, and then patterned and etched using a variety of conventional materials and methods. For example, the hard mask 30 may comprise $Si_3N_4$, $SiO_3N_4$, SiC, or any other suitable hard mask material, having a thickness preferably within the range of about 100 Å to about 5000 Å, more preferably within the range of about 500 Å to about 2000 Å. The hard mask 30 can be patterned using a number of well-known techniques, such as, for example, conventional photolithography and etching processes.

Figure 3B:
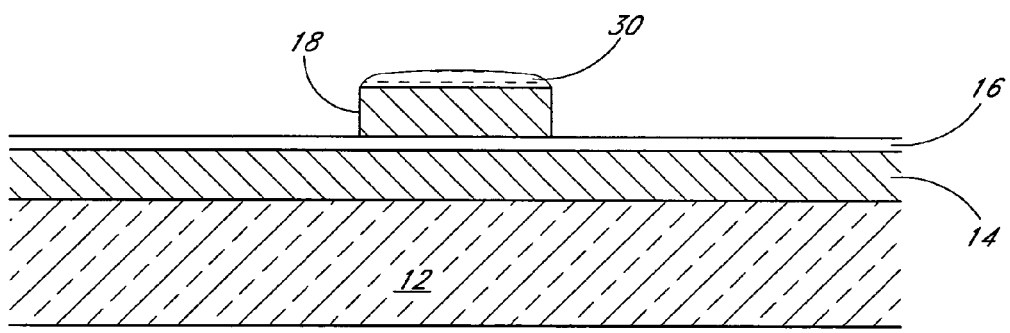

As illustrated in FIG. 3B, the sense layer 18 is etched in the areas that are not covered by the hard mask 30. This etch can be performed using a variety of well-known processes, such as, for example, ion milling, reactive ion etching, or chemical etching. If a process involving a chemical etchant is selected, any of a number of well-known etchants can be used, such as, for example, $CO_2$—$NH_3$ or CO—$NH_3$. The etching of the sense layer 18 preferably stops at the barrier layer 16. The hard mask 30 is also partially etched during the etching of the sense layer 18.

After the sense layer 18 is etched, the resulting structure can be optionally oxidized to transform the outer portions of the sense layer 18 into a nonconductive material (not shown). This optional oxidation step can be performed using an oxidant such as, for example, $O_3$, at a flow rate preferably within the range of about 1 sccm to about 1000 sccm, more preferably within the range of about 100 sccm to about 500 sccm. In other embodiments, this optional oxidation step involves using $O_2$ as an oxidant during a plasma oxidation process. Because this optional oxidation step reduces the amount of conductive surface area around the sides of the sense layer 18, it advantageously reduces the likelihood of a conductive path forming between the pinned layer 14 and the sense layer 18.

Figure 3C:
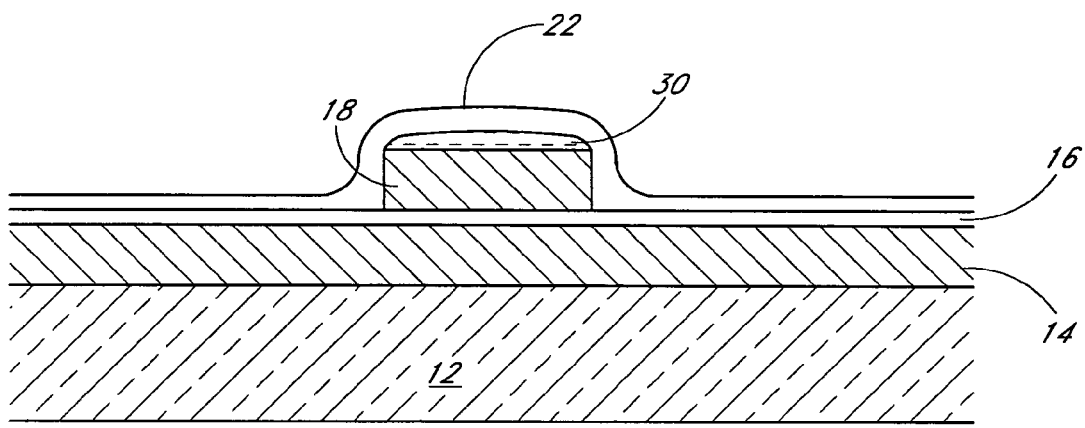

As illustrated in FIG. 3C, a blanket layer of spacer material 22 is deposited over the existing layers. The spacer material 22 can be any suitable material (e.g., $Si_3N_4$) but preferably comprises a low k electrical insulator, with k value preferably less than 3.5, more preferably less than 3.0. A variety of materials exist that can be used as the spacer material 22, such as, for example, silicon nitride, diamond-like carbon, silicon carbide, or an oxide such as silicon oxide or aluminum oxide.

The spacer material 22 can be deposited using any suitable process, such as, for example, physical vapor deposition or chemical vapor deposition. In some embodiments, the thickness of the layer of spacer material 22 preferably falls within the range of about 5 nm to about 100 nm, and more preferably within the range of about 20 nm to about 40 nm.

Figure 3D:
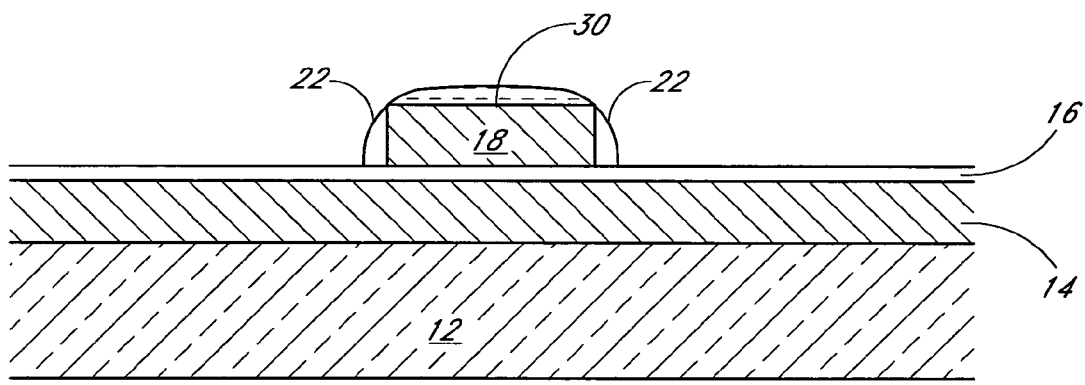

As illustrated in FIG. 3D, the layer of spacer material 22 is etched, preferably using an anisotropic etch process that preferentially etches the horizontal portions of the layer of spacer material 22 relative to the vertical portions of the layer of spacer material 22. Therefore, an etching process with a physical component is preferably used, such as an ion milling process or a reactive ion etch. In some embodiments, for example, a reactive ion etch is used with an appropriate etchant for the selected spacer material 22. For example, in some embodiments, the spacer material 22 comprises silicon nitride and the etchant comprises $CF_4$ or $CHF_3$. In other exemplary embodiments, the spacer material 22 comprises diamond-like carbon and the etchant comprises oxygen-based plasma. In other exemplary embodiments, the spacer material 22 comprises silicon carbide and the etchant comprises $CF_4$, $CH_2F_2$, or $C_2F_6$.

In the embodiment illustrated in FIG. 3D, the spacer etch process stops at the barrier layer 16. In other embodiments, the spacer etch process continues until the pinned layer 14 is reached. In these embodiments, the barrier layer 16 is also etched as part of the same process that etches the layer of spacer material 22.

Figure 3E:
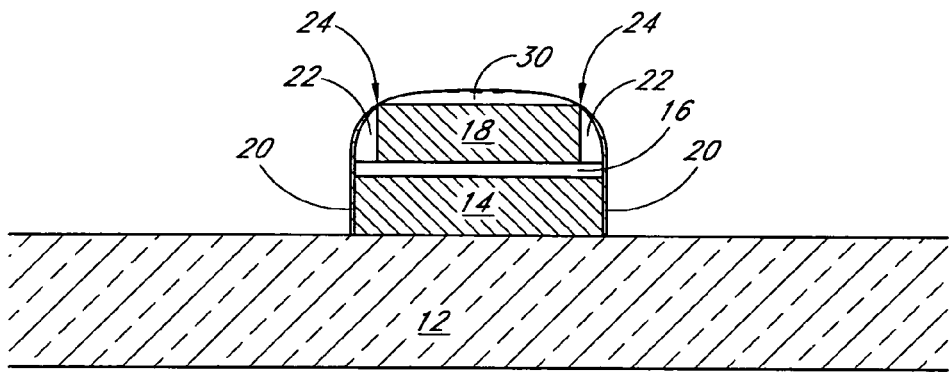

As illustrated in FIG. 3E, after the spacer etch process is complete, the remaining layers are etched. In some embodiments, the process used to etch the remaining layers is substantially similar to the process used to etch the sense layer 18. This process may comprise, for example, ion milling, reactive ion etching, or chemical etching, and may use an etchant such as, for example, $CO_2$—$NH_3$ or CO—$NH_3$. The hard mask 30 is also partially etched during the etching of the pinned layer 14.

As the pinned layer 14 is etched, a thin coating of conductive material 20 may form along the sidewalls of the memory cell 10. The thin coating of conductive material 20 may comprise particles of the pinned layer 14 that are thrown up as byproducts of the etching process of the pinned layer 14. As discussed above, the thin coating of conductive material 20 may form a conductive path between the pinned layer 14 and the sense layer 18, thereby creating an electrical short across the barrier layer 16 that can cause the memory cell 10 to malfunction. Although the spacers 22 minimize the amount of exposed conductive surface area around the sides of the sense layer 18, and thus reduce the likelihood of a conductive path forming between the pinned layer 14 and the sense layer 18, such a conductive path can still exist if there is even only a small point of contact 24 between the thin coating of conductive material 20 and the sense layer 18.

Figure 3F:
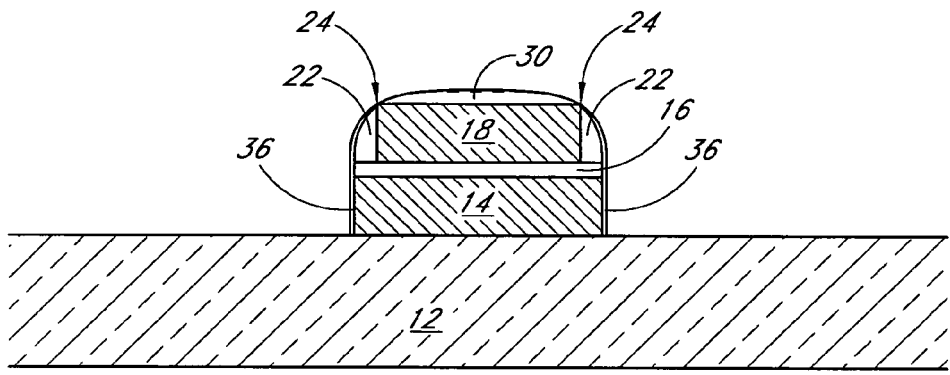

Accordingly, to further reduce the likelihood of a conductive path forming between the pinned layer 14 and the sense layer 18, the thin coating of conductive material 20 can be oxidized to transform the conductive material 20 into a nonconductive material 36, as illustrated in FIG. 3F. This oxidation step can be performed using an oxidant such as, for example, $O_3$, at a flow rate preferably within the range of about 1 sccm to about 1000 sccm, more preferably within the range of about 100 sccm to about 500 sccm. In other embodiments, this oxidation step involves using $O_2$ as an oxidant during a plasma oxidation process. It should be understood that, although the thin coating of nonconductive material 36 is illustrated as one continuous layer in FIGS. 3E–3F, it may be formed as a discontinuous layer.

Figure 3G:
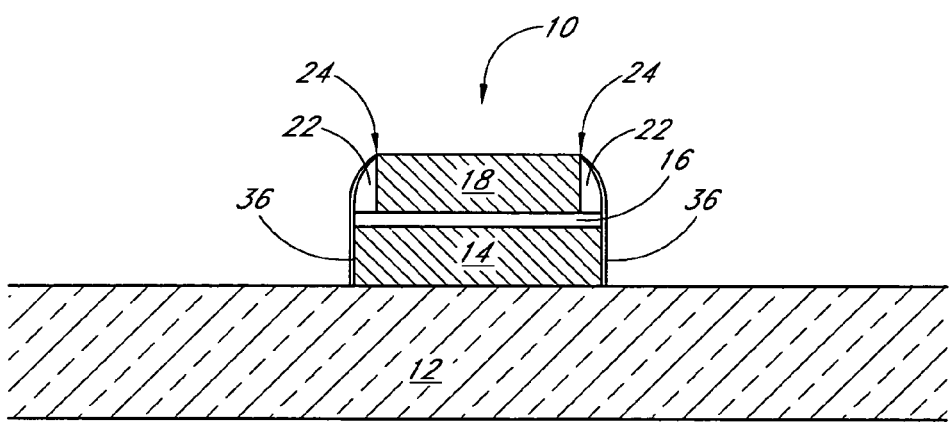

As illustrated in FIG. 3G, the remaining portion of the hard mask 30 is removed to complete the process of forming the memory cell 10. By oxidizing the conductive material 20, thereby transforming it into a nonconductive material 36, the likelihood of a conductive path forming between the pinned layer 14 and the sense layer 18 due to a small point of contact 24 between the layer of nonconductive material 36 and the sense layer 18 is substantially reduced. Accordingly, the number of memory cells 10 within an MRAM array that malfunction due to electrical shorts is reduced, and the yield of the manufacturing process for the MRAM device is advantageously improved.

Figure 4A:
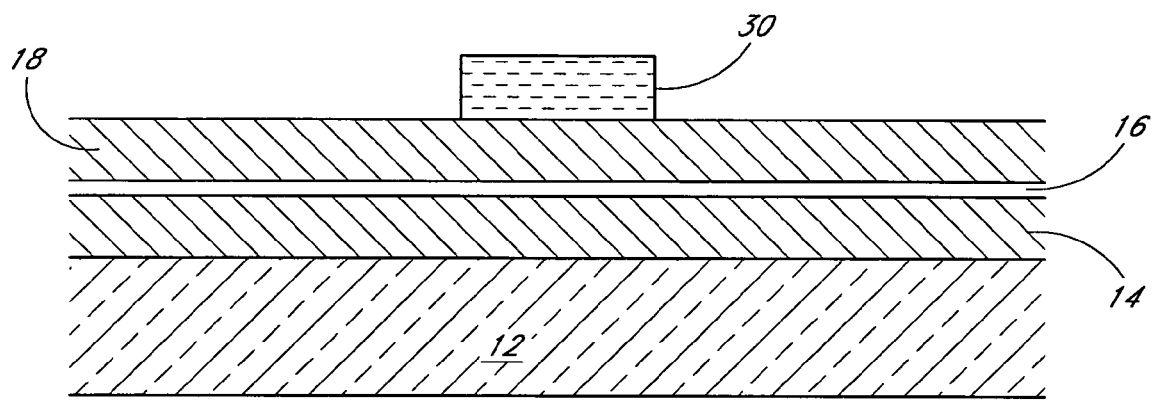
FIGS. 4A–4E illustrate the formation of a magnetic memory cell in accordance with another embodiment of the invention.
Figure 4B:
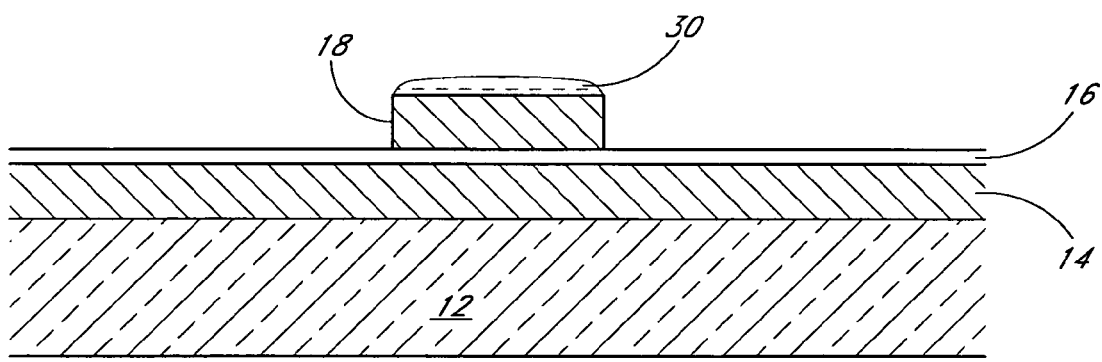

FIGS. 4A–4G illustrate an alternative process for forming a magnetic memory cell 10 in accordance with one embodiment of the invention, which is somewhat similar to the embodiment of the invention described above. For example, as illustrated in FIGS. 4A–4B, the process begins with the same steps described above in connection with FIGS. 3A–3B.

Figure 4C:
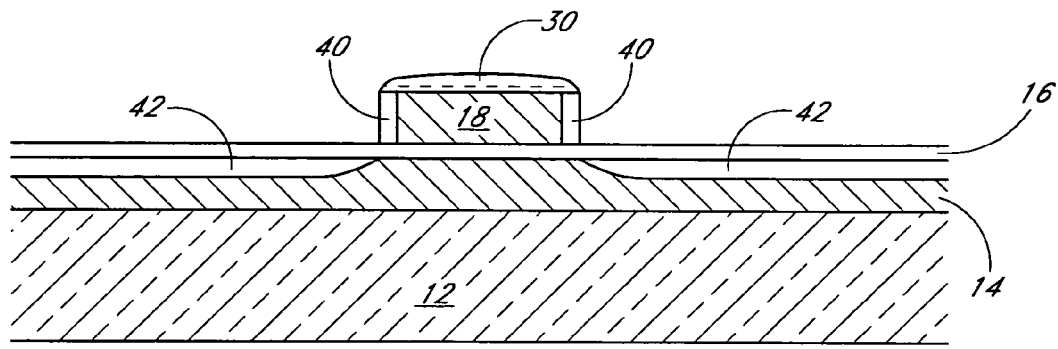

In the present embodiment, however, after the sense layer 18 is etched, the resulting structure is repeatedly subjected to alternating partial oxidation and partial etch steps until the memory cell 10 is formed. In some embodiments, the partial oxidation steps are performed by subjecting the structure to plasma oxidation using a process that is substantially similar to the optional oxidation step described above in connection with FIG. 3B. As illustrated in FIG. 4C, when the structure is subjected to plasma oxidation, the outer or sidewall portions 40 of the sense layer 18 and the upper portion 42 of the pinned layer 14 are transformed into a nonconductive material, except for the portions that are protected under the hard mask 30.

Figure 4D:
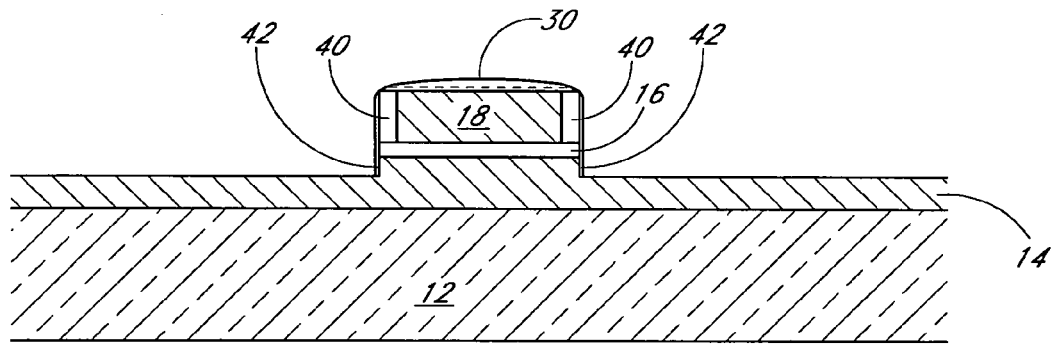

As illustrated in FIG. 4D, the pinned layer 14 can then be partially etched because, even if particles from the upper portion of the pinned layer 14 are deposited along the sidewalls of the structure as byproducts of the etching process, the particles are nonconductive and thus unlikely to cause an electrical short across the barrier layer 16. In addition, the grown sidewall spacer in the form of outer portions 40 further reduces the likelihood of a short forming across the barrier layer 16. To perform the partial etch of the pinned layer 14, an etching process with a physical component is preferably used, such as an ion milling process or a reactive ion etch. The partial etch preferably stops before the portion of the pinned layer 14 below the upper portion 42 is reached, such that only nonconductive particles tend to be thrown up along the sidewalls of the memory cell 10 as byproducts of the etching process.

Figure 4E:
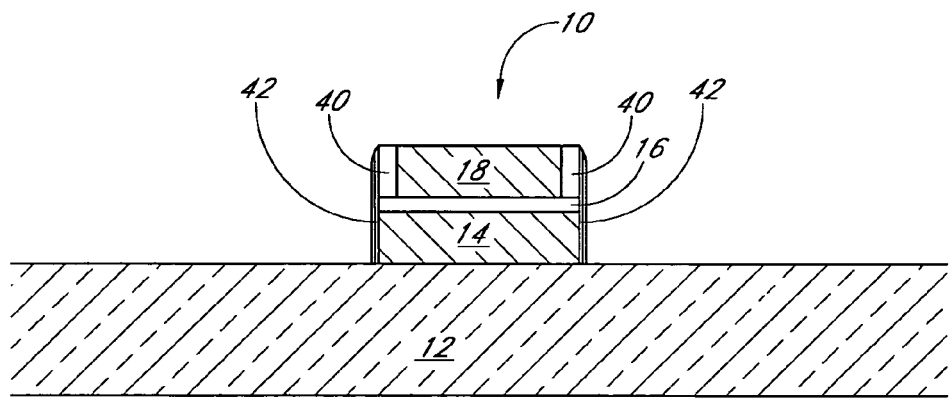

The steps illustrated in FIGS. 4C–4D can be repeated cyclically until the entire pinned layer 14 has been oxidized and etched. In a preferred embodiment, both the oxidation and the etching steps can be performed in situ within the same tool. Then, as illustrated in FIG. 4E, the remaining portion of the hard mask 30 can be removed to complete the process of forming the memory cell 10. By repeatedly partially oxidizing and etching the pinned layer 14 such that only nonconductive particles can be deposited along the sidewalls of the memory cell 10 during the fabrication process, the likelihood of a conductive path forming between the pinned layer 14 and the sense layer 18 is substantially reduced. Accordingly, the number of memory cells 10 within an MRAM array that malfunction due to electrical shorts is reduced, and the yield of the manufacturing process for the MRAM device is advantageously improved.

In addition, the process illustrated in FIGS. 4A–4E is advantageously self-aligning because the region under the hard mask 30 is protected from both oxidation and etching. Therefore, although the process involves repeating a series of alternating oxidation and etching steps, the process involves only a single masking step. Because no additional masks are needed to perform the alternating oxidation and etching steps, the process can advantageously be performed at a relatively low cost.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

We claim:

1. A method of forming a magnetic memory cell, comprising:
   providing a first conductive layer as a blanket layer;
   providing a barrier layer as a blanket layer over the first conductive layer;
   providing a second conductive layer as a blanket layer over the barrier layer;
   providing a hard mask over the second conductive layer, wherein the hard mask defines the region in which the magnetic memory cell is formed;
   etching the second conductive layer to form an upper portion of the magnetic memory cell;
   forming a spacer around the upper portion of the magnetic memory cell;
   etching the barrier layer and the first conductive layer to form a lower portion of the magnetic memory cell, wherein conductive particles of the first conductive layer may be thrown up along a sidewall of the magnetic memory cell as byproducts of the etching of the first conductive layer; and
   oxidizing the magnetic memory cell using $O_3$ as an oxidant at a flow rate within the range of about 100 sccm to about 500 sccm, thereby transforming the conductive particles into nonconductive particles.

2. The method of claim 1, further comprising oxidizing the outer portions of the second conductive layer after it is etched to form the upper portion of the magnetic memory cell.

3. The method of claim 2, wherein oxidizing the outer portions of the second conductive layer comprises using O3 as an oxidant, at a flow rate within the range of about 100 sccm to about 500 sccm.

4. The method of claim 1, wherein the first conductive layer comprises a first sublayer comprising tantalum, a second sublayer comprising nickel-iron, a third sublayer comprising magnesium oxide, iridium-manganese platinum-manganese or nickel-manganese, and a fourth sublayer comprising nickel-iron or cobalt-iron.

5. The method of claim 4, wherein the first conductive layer has a thickness within the range of about 1 nm to about 30 nm.

6. The method of claim 1, wherein the barrier layer comprises aluminum oxide and has a thickness within the range of about 0.5 nm to about 3 nm.

7. The method of claim 1, wherein the second conductive layer comprises a first sublayer comprising tantalum, a second sublayer comprising tungsten nitride, and a third sublayer comprising nickel-iron, cobalt or copper.

8. The method of claim 7, wherein the second conductive layer has a thickness within the range of about 1 nm to about 30 nm.

9. The method of claim 1, wherein the hard mask comprises a material selected from the group consisting of silicon nitride, silicon oxynitride, and silicon carbide.

10. The method of claim 9, wherein the hard mask has a thickness within the range of about 500 Å to about 2000 Å.

11. The method of claim 1, wherein etching the second conductive layer comprises ion milling, reactive ion etching, or chemical etching.

12. The method of claim 11, wherein etching the second conductive layer comprises using $CO_2$—$NH_3$ or CO—$NH_3$ as an etchant.

13. The method of claim 1, wherein forming a spacer comprises:
   depositing a layer of nonconductive material as a blanket layer over the upper portion of the memory cell; and
   anisotropically etching the layer of nonconductive material such that the horizontal portions of the layer are preferentially removed relative to the vertical portions of the layer.

14. The method of claim 13, wherein the layer of nonconductive material has a thickness within the range of about 5 nm to about 100 nm.

15. The method of claim 13, wherein anisotropically etching the layer of nonconductive material comprises ion milling or reactive ion etching.

16. The method of claim 15, wherein the nonconductive material comprises silicon nitride and anisotropically etching the layer of nonconductive material comprises using a fluorocarbon as an etchant.

17. The method of claim 15, wherein the nonconductive material comprises diamond-like carbon and anisotropically etching the layer of nonconductive material comprises using oxygen-based plasma as an etchant.

18. The method of claim 15, wherein the nonconductive material comprises silicon carbide and anisotropically etching the layer of nonconductive material comprises using a fluorocarbon as an etchant.

19. The method of claim 1, wherein the spacer comprises a low k electrical insulator having a k value of less than about 3.5.

20. The method of claim 19, wherein the spacer comprises a material selected from the group consisting of silicon nitride, diamond-like carbon, silicon carbide, silicon oxide, and aluminum oxide.

21. The method of claim 1, wherein etching the barrier layer and the first conductive layer comprises ion milling, reactive ion etching, or chemical etching.

22. The method of claim 21, wherein etching the barrier layer and the first conductive layer comprises using $CO_2$—$NH_3$ or $CO$—$NH_3$ as an etchant.

23. The method of claim 1, wherein the memory cell comprises a tunneling magnetoresistance (TMR) memory cell.

24. A method of forming a magnetic memory cell, comprising:
   providing a first conductive layer, a barrier layer, and a second conductive layer as blanket layers;
   providing a hard mask over the second conductive layer, wherein the hard mask defines the region in which the magnetic memory cell is formed;
   etching the second conductive layer and the barrier layer to form an upper portion of the magnetic memory cell;
   partially oxidizing the first conductive layer using $O_3$ as an oxidant, at a flow rate within the range of about 100 sccm to about 500 sccm such that at least a portion of the first conductive layer is transformed into an insulating material;
   at least partially etching the portion of the first conductive layer that was transformed into an insulating material during the partial oxidizing step; and
   repeating the partial oxidizing and partial etching steps until the first conductive layer forms a lower portion of the magnetic memory cell.

25. The method of claim 24, wherein the first conductive layer comprises a first sublayer comprising tantalum, a second sublayer comprising nickel-iron, a third sublayer comprising magnesium oxide, iridium-manganese, platinum-manganese or nickel-manganese, and a fourth sublayer comprising nickel-iron or cobalt-iron.

26. The method of claim 25, wherein the first conductive layer has a thickness within the range of about 1 nm to about 30 nm.

27. The method of claim 24, wherein the barrier layer comprises aluminum oxide and has a thickness within the range of about 0.5 nm to about 3 nm.

28. The method of claim 24, wherein the second conductive layer comprises a first sublayer comprising tantalum, a second sublayer comprising tungsten nitride, and a third sublayer comprising nickel-iron, cobalt or copper.

29. The method of claim 28, wherein the second conductive layer has a thickness within the range of about 1 nm to about 30 nm.

30. The method of claim 24, wherein the hard mask comprises a material selected from the group consisting of silicon nitride, silicon oxynitride, and silicon carbide.

31. The method of claim 30, wherein the hard mask has a thickness within the range of about 500 Å to about 2000 Å.

32. The method of claim 24, wherein etching the second conductive Layer and the barrier layer comprises ion milling, reactive ion etching, or chemical etching.

33. The method of claim 32, wherein etching the second conductive layer and the baffler layer comprises using $Co_2$—$NH_3$ or $CO$—$NH_3$ as an etchant.

34. The method of claim 24, wherein partially etching the first conductive layer comprises ion milling, reactive ion etching, or chemical etching.

35. The method of claim 34, wherein partially etching the first conductive layer comprises using $CO_2$—$NH_3$ or $CO$—$NH_3$ as an etchant.

36. The method of claim 24, wherein the memory cell comprises a tunneling magnetoresistance (TMR) memory veil.

* * * * *

UNITED STATES PATENT AND TRADEMARK OFFICE
CERTIFICATE OF CORRECTION

PATENT NO. : 7,112,454 B2 Page 1 of 1
APPLICATION NO. : 10/684967
DATED : September 26, 2006
INVENTOR(S) : Drewes et al.

It is certified that error appears in the above-identified patent and that said Letters Patent is hereby corrected as shown below:

Column 3, line 31, please delete "baffler" and insert therefore, --barrier--.

Column 4, line 58, please delete "µm" and insert therefore, --nm--.

Column 8, line 10, after "oxidant" please insert--,--.

Column 8, line 18, please delete "O3" and insert therefore, --$O_3$--.

Column 8, line 24, after "manganese" please insert--,--.

Column 10, line 30, please delete "Layer" and insert therefore, --layer--.

Column 10, line 33, please delete "baffler" and insert therefore, --barrier--.

Column 10, line 34, please delete "$Co_2$" and insert therefore, -- $CO_2$--.

Column 10, line 43, please delete "veil" and insert therefore, --cell--.

Signed and Sealed this

Sixteenth Day of January, 2007

JON W. DUDAS
*Director of the United States Patent and Trademark Office*